(12) United States Patent
Thuerlemann

(10) Patent No.: US 6,739,493 B2
(45) Date of Patent: May 25, 2004

(54) DEVICE WITH AN ELECTRODE FOR THE FORMATION OF A BALL AT THE END OF A WIRE

(75) Inventor: Silvan Thuerlemann, Unterägeri (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 10/454,891

(22) Filed: Jun. 5, 2003

(65) Prior Publication Data
US 2004/0011849 A1 Jan. 22, 2004

(30) Foreign Application Priority Data
Jul. 19, 2002 (CH) ............................................. 1281/02

(51) Int. Cl.$^7$ ............................................. B23K 20/10
(52) U.S. Cl. ....................... 228/4.5; 219/56.1
(58) Field of Search ............................ 228/110.1, 4.5, 228/180.5, 102; 257/E21.518, E21.519; 219/56.1, 56, 56.21, 56.22

(56) References Cited

U.S. PATENT DOCUMENTS 4,564,734 A * 1/1986 Okikawa .................. 219/56.22
4,575,602 A * 3/1986 Sakurai .................... 219/56.21
5,263,631 A   11/1993 Felber
6,129,255 A * 10/2000 Terakado et al. ............ 228/4.5

FOREIGN PATENT DOCUMENTS

| EP | 0 276 564 B1 | 12/1987 |
| GB | 2 165 178 A | 10/1984 |
| JP | 04-279039 | * 5/1992 |

* cited by examiner

Primary Examiner—Kiley Stoner
Assistant Examiner—Jonathan Johnson
(74) Attorney, Agent, or Firm—McCormick, Paulding & Huber LLP

(57) ABSTRACT

With a device for the formation of a wire ball at the end of a wire an in and out swivelling electrode with an oblong shape is connected to the shaft of a motor directly or indirectly via a connecting piece so that the electrode is essentially rotated on its longitudinal axis when swivelling in and out. The mass inertia of the electrode is low as regards the rotational axis which is why it can be turned with negligible expenditure of energy. On swivelling in and out, the electrode is turned back and forth between a lower limit position in which a surface necessary for creating the spark, the so-called firing lug is located underneath the capillary of the Wire Bonder and an upper limit position in which the firing lug is located laterally elevated next to the capillary.

4 Claims, 4 Drawing Sheets

DEVICE WITH AN ELECTRODE FOR THE FORMATION OF A BALL AT THE END OF A WIRE

CROSS REFERENCE TO RELATED APPLICATION

Figure 1:
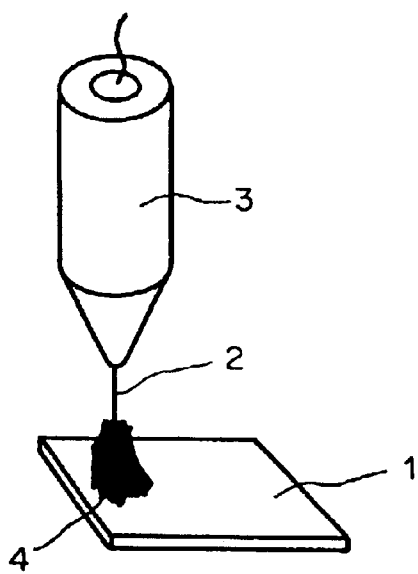

Applicant hereby claims foreign priority under 35 U.S.C. §119 from Swiss Application No. 2002 1281/02 filed Jul. 19, 2002, the disclosure of which is herein incorporated by reference.

FIELD OF THE INVENTION

The invention concerns a device with an electrode for the formation of a ball at the end of a wire.

BACKGROUND OF THE INVENTION

Such devices are used on so-called Wire Bonders. A Wire Bonder is a machine with which semiconductor chips are wired after mounting on a substrate. The Wire Bonder has a capillary which is clamped to the tip of a horn. The capillary serves to secure the wire to a connection point on the semiconductor chip and to a connection point on the substrate as well as to guide the wire between the two connection points. On producing the wire connection between the connection point on the semiconductor chip and the connection point on the substrate, the end of the wire protruding out of the capillary is first melted into a ball. Afterwards, the wire ball is secured to the connection point on the semiconductor chip by means of pressure and ultrasonics. In doing so, ultrasonics is applied to the horn from an ultrasonic transducer. This process is called ball bonding. The wire is then pulled through to the required length, formed into a wire loop and welded to the connection point on the substrate. This last part of the process is called wedge bonding. After securing the wire to the connection point on the substrate, the wire is torn off and the next bonding cycle can begin.

In order to form the end of the wire protruding out of the capillary into a ball, a high DC voltage is applied between the wire and the electrode so that an electrical spark occurs which melts the wire. The voltage at which the electrical breakdown of the ionised air takes place between the wire and the electrode and the spark is created is designated as sparking voltage.

Today, three types of devices are known for the formation of a wire ball at the end of a wire which prevail on the market. These three types are explained based on FIGS. 1 to 3. With the first type (FIG. 1), a flat electrode 1 is swivelled from the side under the capillary 3 which guides the wire 2. With this arrangement of electrode and wire, the electrical spark 4 is formed in the longitudinal direction of the wire. The electrical spark 4 therefore runs symmetrically to the wire. The advantage of this type is that the symmetry of the formed ball is comparatively high. On the other hand, the disadvantage is that the swivelling in and out of the electrode costs time. Furthermore, the swivelling in and out of the electrode can stimulate oscillations of the bondhead.

With the second type (FIG. 2), an electrode 1 with a tip is arranged laterally offset underneath the capillary. With this arrangement, the electrical spark 4 runs non-symmetrically to the longitudinal axis of the wire which tends to lead to the formation of asymmetrical wire balls. However, the asymmetry of these wire balls has a predominant direction. This makes it possible to reduce the asymmetry with additional measures. In addition, this arrangement requires a higher sparking voltage in comparison to the first type. With the same vertical distance to the downholder plate which is located immediately below the device and holds the connection fingers on the substrate in position, this leads to a greater occurrence of electrical discharges on the downholder plate.

With the third type (FIG. 3), the electrode 1 is a rotationally symmetrical ring electrode. After formation of the wire ball, the capillary 3 is lowered down through the electrode. The advantage of this arrangement is that the voltage necessary for creating the electrical spark is lower than with the first two types. The disadvantage is that the place where the electrical spark 4 is created constantly changes. Wire balls formed with this arrangement also have a tendency towards asymmetries, however these asymmetries have no predominant direction.

A further device for the formation of a wire ball is known from the U.S. Pat. No. 5,263,631. This device has three pointed electrodes which are separately electrically controlled in order to regulate the currents flowing through the individual electrodes.

SUMMARY OF THE INVENTION

The object of the invention is to develop a device for the formation of a ball at the end of a wire which is distinguished by a low sparking voltage and with which wire balls can be formed which are symmetrical to the longitudinal axis of the wire and the size of which varies as little as possible.

For a device for the formation of a ball at the end of a wire, the invention consists in using an electrode with a longitudinal shape which can be swivelled in and out and which is attached directly, or indirectly via a connection part, to the shaft of a motor so that, when swivelling in and out, the electrode is essentially turned on its longitudinal axis. (However, the rotational axis and the longitudinal axis of the electrode do not necessarily coincide.) The electrode is preferably divided into three sections at angles to each other. The shape of the electrode can be broadly designated as being s-shaped. The mass inertia of the electrode is low as regards the rotational axis. The electrode can therefore be rotated with little expenditure of energy. On swivelling in and out, the electrode is turned back and forth between a lower limit position in which a surface necessary for spark formation, the so-called firing lug (which in the art is also known as flame off plate), is located underneath the capillary of the Wire Bonder, and an upper limit position in which the firing lug is located laterally elevated next to the capillary.

BRIEF DESCRIPTION OF THE DRAWING FIGURES

Figure 2:
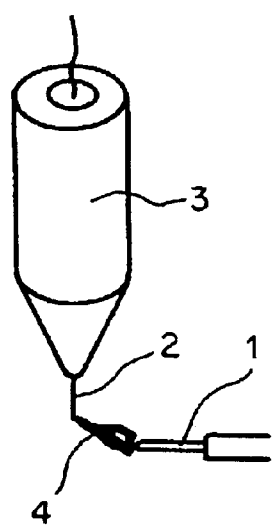
Figure 3:
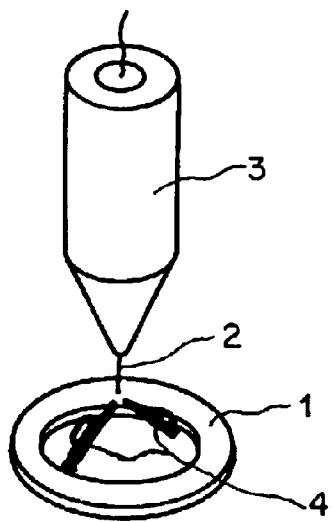
Figure 4:
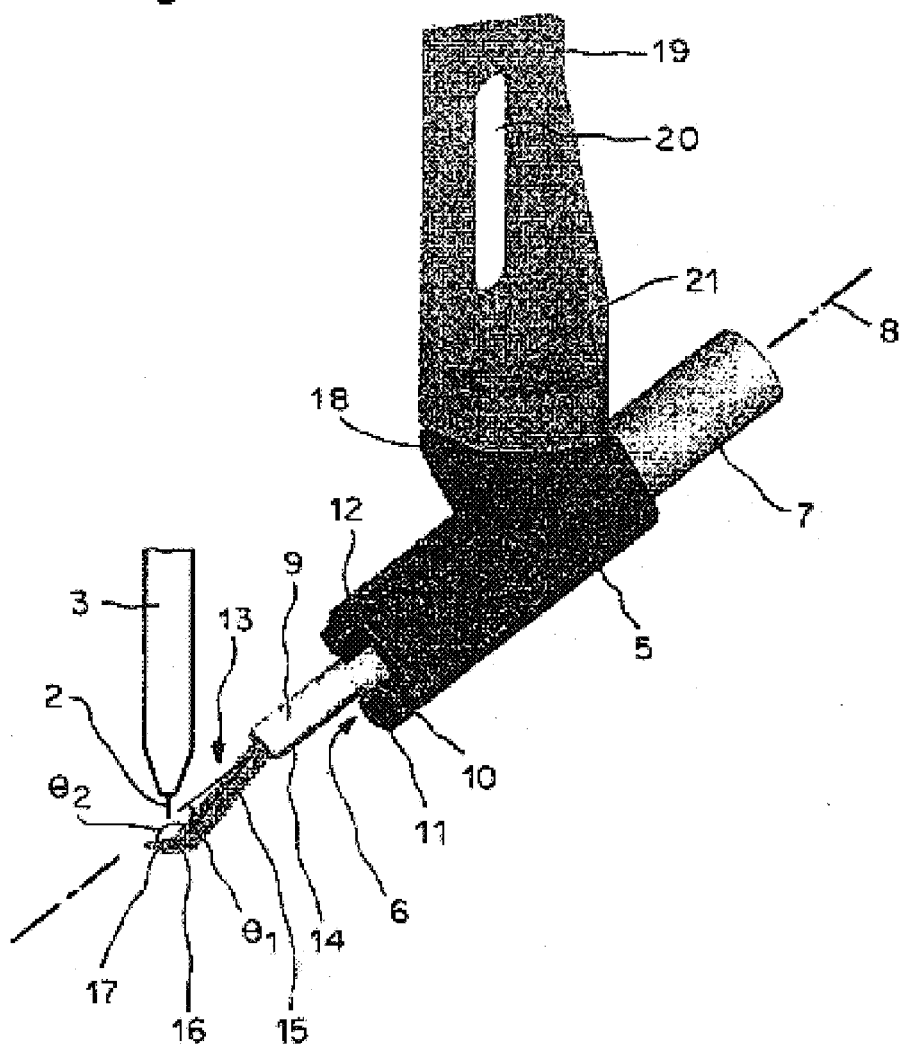
Figure 5:
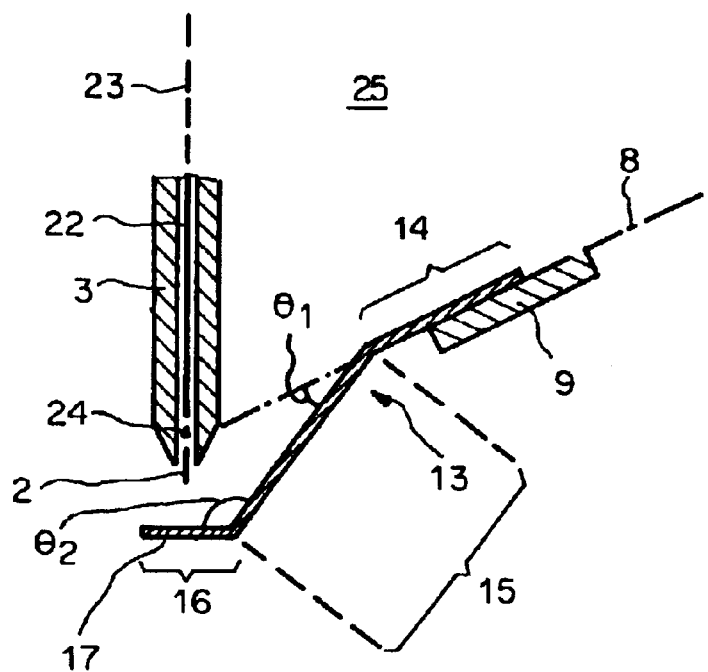
Figure 6:
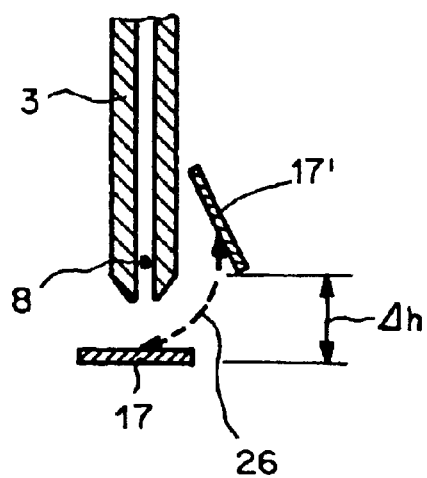
Figure 7:
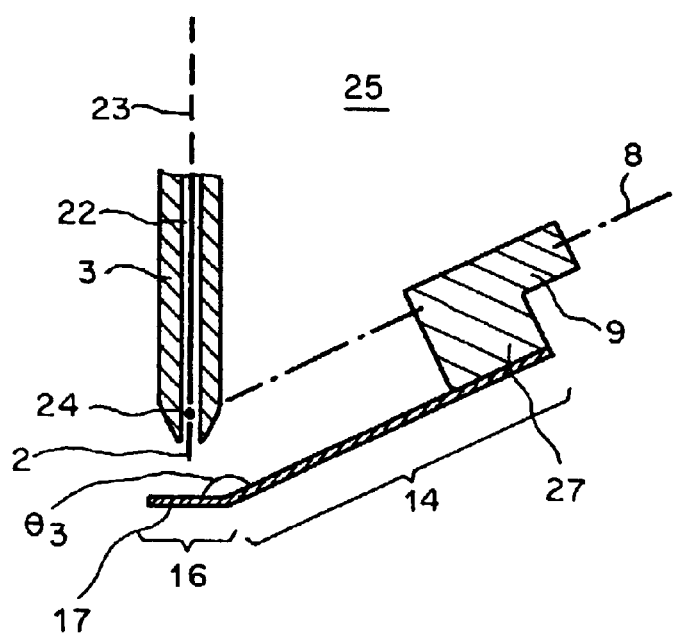

The accompanying drawings, which are incorporated into and constitute a part of this specification, illustrate one or more embodiments of the present invention and, together with the detailed description, serve to explain the principles and implementations of the invention. The figures are not to scale. In the drawings:

FIGS. 1–3 show three types of device of prior art for the formation of a wire ball at the end of a wire, FIG. 4 shows a perspective view of a first embodiment of a device in accordance with the invention for the formation of a wire ball at the end of a wire, FIGS. 5, 6 show further schematic views of the device, and FIG. 7 shows a further embodiment of a device in accordance with the invention.

DETAILED DESCRIPTION OF THE PREFERRED EMBODIMENTS

FIG. 4 shows a perspective view of an embodiment of a device in accordance with the invention for the formation of a wire ball at the end of a wire 2 for use on a Wire Bonder. The device is secured laterally next to the capillary 3 on the side of the not presented bondhead of a Wire Bonder. The device comprises a body 5 with a longitudinal drill hole 6. A motor 7 which has a not visible shaft is secured at the rear end of the body 5. The shaft of the motor 7 extends into the longitudinal drill hole 6 and defines a rotational axis 8 which runs in the direction of the longitudinal drill hole 6. A connection piece 9 made of plastic is secured to the shaft. The body 5 has a recess at its front end which is bordered by two surfaces 11 and 12. The connection piece 9 has a cam 10 running at right angles to the drill hole 6 which extends into this recess. The surfaces 11 and 12 serve as stops for the cam 10. A metallic electrode 13 is attached to the connecting piece 9. The electrode 13 has an oblong shape and is divided into three sections 14–16 which are at angles to each other. The first section 14 of the electrode 13 is secured to the connecting piece 9 and runs along the rotational axis 8 or parallel to the rotational axis 8. The second, middle section 15 of the electrode 13 runs diagonally to the rotational axis 8 with which it forms a given angle $\theta_1$. The third section 16 of the electrode 13 forms the free end of the electrode 13 and is designated as the firing lug 17 as this part of the electrode 13 is foreseen for creating the spark to the wire. The firing lug 17 is preferably formed as an even surface. Together with the middle section 15 of the electrode 13, the firing lug 17 forms a given angle $\theta_2$ in such a way that the firing lug 17 points towards the rotational axis 8. The motor 7 turns the electrode 13 back and forth between a lower and an upper limit position. In doing so, the oblong electrode 13 rotates on the rotational axis 8. In the lower limit position, the cam 10 comes to stop on the surface 11. In the upper limit position, the cam 10 comes to stop on the surface 12.

The body 5 has a plinth 18 the surface of which runs horizontally. A detachable securing piece 19 is attached to the plinth 18 with a screw (the screw is not presented in the figure). The securing piece 19 has two slots 20 and 21 so that, on the one hand the body 5 can be adjustably attached to the securing piece 19 and, on the other hand, the securing piece 19 can be adjustably attached to the bondhead of the Wire Bonder. Thanks to the slot 21, the height of the device can be precisely adjusted. Thanks to slot 20, the plinth 18 can be shifted and turned in both horizontal directions relative to the securing piece 19. In this way, the position of the rotational axis 8 can be adjusted so that the firing lug 17 is located in the desired position underneath the capillary 3.

FIG. 5 shows schematically the capillary 3 of a Wire Bonder and parts of the device in accordance with the invention for the formation of a wire ball at the end of a wire 2 protruding out of the capillary 3. The wire 2 is led through a longitudinal drill hole 22 of the capillary 3. The longitudinal drill hole 22 of the capillary 3 defines a longitudinal axis 23. The longitudinal axis 23 of the capillary 3 and the rotational axis 8 of the device cross at point 24 (for reasons of illustrative clarity, the wire 2 is shown here as broken) and therefore create a plane 25. FIG. 5 shows a section of the capillary 3 and the device through this plane 25. The electrode 13 is located swivelled in underneath the capillary 3 in the lower limit position in which the longitudinal axis 23 of the capillary 3 runs orthogonally to the firing lug 17.

FIG. 6 shows schematically the capillary 3 and the two limit positions of the firing lug 17 in line of sight along the rotational axis 8 whereby the rotational axis 8 cuts the drawing plane at a vertical angle. The firing lug 17 or 17' is located as close as possible to the rotational axis 8. In the example, the distance between the rotational axis 8 and the front edge of the firing lug 17 amounts to around 3 to 4 mm. No point of the electrode 13 is more than 4 mm away from the rotational axis 8. On turning from the lower limit position to the upper limit position, the firing lug 17 is raised by the distance $\Delta h$ which typically amounts to approximately 2–3 mm. The rotational movement of the firing lug 17 on the rotational axis 8 from the lower limit position to the upper limit position is presented as a broken line 26.

For the formation of a wire ball at the end of the wire 2, an electrical voltage is applied between the wire 2 and the electrode 13. For this purpose, the wire 2 and the electrode 13 are connected by means of a spark generator known from prior art. Basically, the spark generator consists of a constant current source. In order to create the electrical spark between the end of the wire and the firing lug 17 of the electrode 13, the air between them must be ionised until an electrical discharge takes place and thereby the spark created. To do so, an increasing DC voltage is built up via the constant current source until the discharge takes place. The first section 14 of the electrode 13 is connected to the spark generator by means of a not presented cable.

Once the wire ball has been formed, the motor 7 is actuated in order to turn the electrode 13 into the upper limit position in which its firing lug 17 is located laterally elevated next to the capillary 3. With this rotation, the firing lug 17 gains in height. The capillary 3 can now be lowered and the wire ball bonded to the semiconductor chip.

The device in accordance with the invention demonstrates several advantages:

In the raised condition, i.e., in the upper limit position, the firing lug 17 is located laterally elevated next to the capillary 3. With the in and out swivelling electrodes in accordance with prior art, the height of the electrode does not change or only changes negligibly on swivelling in and out. The height to which the capillary 3 and the electrode 13 always have to be raised in order that the substrate can be further transported can therefore be reduced by around 2 mm compared to prior art which reduces the duration of the bond cycle.

The rotational axis 8, on which the electrode 13 is rotated in order to swivel in and out and the main axis of the moment of inertia of the electrode 13 do not actually coincide but lie close together. The electrode 13 can therefore be swivelled in and out with considerably less expense of energy than with prior art. For this reason, a smaller and therefore lighter motor 17 can be used. The reduction in the mass which has to be moved for rotating the electrode 13 has the result that, on the one hand the swivelling in and out of the electrode 13 stimulates the bondhead to oscillate to a much lesser degree and, on the other hand, the total weight of the bondhead is reduced.

FIG. 7 shows a further embodiment of a device in accordance with the invention for the formation of a wire ball at the end of the wire 2 protruding out of the capillary 3 in the same presentation as FIG. 5. The longitudinal axis 23 of the capillary 3 and the rotational axis 8 of the device running diagonally to the horizontal and to the vertical again cross at a point 24 and form the plane 25. The electrode 13 is located swivelled in underneath the capillary 3 in the lower limit position in which the longitudinal axis 23 of the capillary 3 runs orthogonally to the firing lug 17. With this embodiment, the oblong electrode 13 is only divided into two sections 14 and 16 which are at angles to each other. The two sections 14 and 16 form a predetermined angle $\theta_3$. The connecting piece 9 is widened and has, for example, an extension 27 to which section 14 of the electrode 13 is attached. The section 14 of the electrode 13 runs parallel to the rotational axis 8. With this embodiment, the moment of inertia is somewhat greater as regards the rotational axis 8 than with the first embodiment. As also with this embodiment no point of the electrode 13 is more than 4 mm (Millimeter) away from the rotational axis 8, the electrode 13 can still be turned on the rotational axis 8 with negligible expenditure of energy.

For manufacturing reasons, it is of advantage when the first section 14 of the electrode 13 runs parallel to the rotational axis 8 for the first as well as for the second embodiment. However, other constructions are also possible where this is not the case and where the advantages of the invention are still given. Under certain circumstances it is also possible to attach the electrode 13 directly to the shaft of the motor 17 and to omit the connecting piece 9.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A device for forming a ball at an end of a wire running through a longitudinal drill hole of a capillary and protruding out of the capillary, the longitudinal drill hole of the capillary defining a longitudinal axis, the device comprising:

a motor with a shaft, the shaft defining a rotational axis, and an electrode having an oblong shape and divided into at least a first and a second section, the first section attached either directly or by means of a connecting piece to the shaft of the motor, the second section which serves as a firing lug forming a predetermined angle with the first section, wherein the rotational axis runs diagonally to the longitudinal axis and wherein the motor turns the electrode on the rotational axis to and fro between a first limit position and a second limit position so that the firing lug of the electrode in the first limit position is located underneath the capillary and in the second limit position is located laterally elevated next to the capillary.

2. The device according to claim 1, wherein no point of the electrode is more than four millimeters away from the rotational axis.

3. A device for forming a ball at an end of a wire running through a longitudinal drill hole of a capillary and protruding out of the capillary, the longitudinal drill hole of the capillary defining a longitudinal axis, the device comprising:

a motor with a shaft, the shaft defining a rotational axis, and an electrode having an oblong shape and divided into a first, second and third section, the first section attached either directly or by means of a connecting piece to the shaft of the motor, the second section forming a predetermined angle with the first section and the third section which serves as a firing lug forming a further predetermined angle with the second section, wherein the rotational axis runs diagonally to the longitudinal axis and wherein the motor turns the electrode on the rotational axis to and fro between a first limit position and a second limit position so that the firing lug of the electrode in the first limit position is located underneath the capillary and in the second limit position is located laterally elevated next to the capillary.

4. The device according to claim 3, wherein no point of the electrode is more than four millimeters away from the rotational axis.

* * * * *